United States Patent [19]

Croxall et al.

[11] 4,019,950

[45] Apr. 26, 1977

[54] CRYSTALS AND THEIR MANUFACTURE

[75] Inventors: Derek Francis Croxall, London; Robert Christopher Kell, South Harrow; Robert Lambert, Eastbourne, all of England

[73] Assignee: The General Electric Company Limited, London, England

[22] Filed: Nov. 7, 1975

[21] Appl. No.: 629,800

[30] Foreign Application Priority Data

Nov. 25, 1974 United Kingdom ............ 50933/74

[52] U.S. Cl. .................... 156/623 R; 156/DIG. 85; 23/305 R; 423/93; 423/433
[51] Int. Cl.² .................. B01J 17/04; C01G 21/14
[58] Field of Search .................... 156/DIG. 85, 623; 23/305 R; 423/93, 433

[56] References Cited

UNITED STATES PATENTS

| | | | |
|---|---|---|---|
| 1,008,977 | 11/1911 | Lyon | 423/433 |
| 1,886,915 | 11/1932 | Sletzer | 423/433 |
| 3,959,453 | 5/1976 | Torikai | 423/93 |

OTHER PUBLICATIONS

Sinclair, Ph.D. Thesis, Carbonate and Bicarbonate Complexes of Lead in Hydrothermal Solutions From 25° to 150° C With Geological Applications, Univ. of Wisconsin, 1973, 122 pages Diss. Abstr. Int. B. 1974, vol. 34, No. 5032.

*Primary Examiner*—Stephen J. Emery
*Attorney, Agent, or Firm*—Kirschstein, Kirschstein, Ottinger & Frank

[57] ABSTRACT

In a hydrothermal process for manufacturing crystals of metal carbonates, including single crystals of lead carbonate of the cerussite crystalline form, the nutrient material consists of a carbonate or basic carbonate of the said metal, the solvent medium consists of a 0.5 to 5.0 molar aqueous solution of an alkali metal bicarbonate, and the heating is carried out in an autoclave under controlled temperature conditions such that the exterior of the autoclave wall adjacent to the nutrient and the solvent medium in the vicinity thereof is maintained at 200° C to 400° C, and that the exterior of the autoclave wall adjacent to the region of the solvent medium remote from the nutrient is maintained at 170° C to 315° C and at a temperature from 5° C to 150° C lower than that of the exterior of the autoclave wall adjacent to the nutrient: a temperature gradient is thus produced in the solvent medium and crystalline metal carbonate is deposited in a region remote from the nutrient, as small crystals on the autoclave wall or as crystal growth on seeds.

7 Claims, 1 Drawing Figure

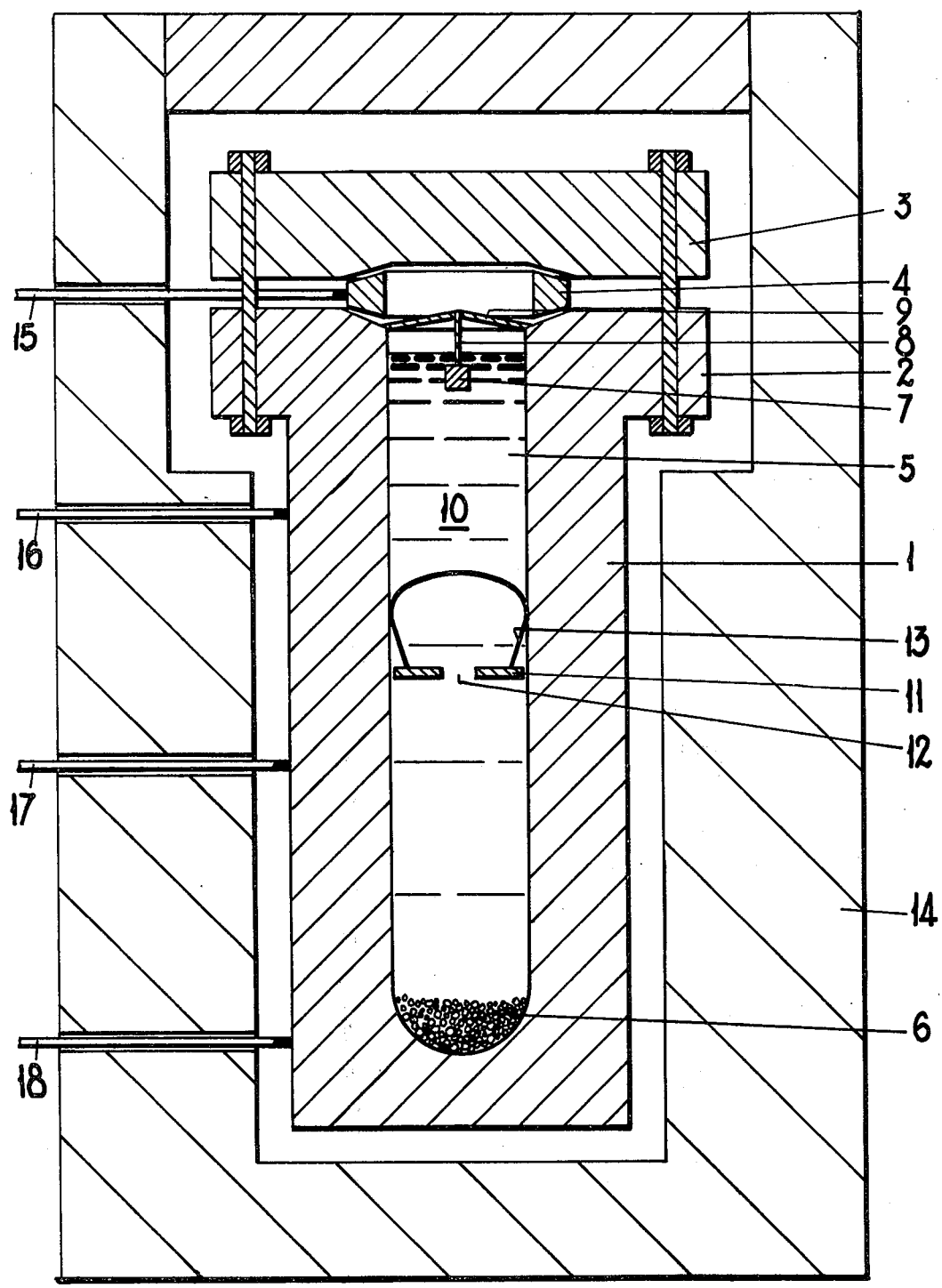

CRYSTALS AND THEIR MANUFACTURE

This invention relates to crystals, and more particularly, but not exclusively, to single crystals which are suitable for use as polariser prisms in electro-optical Q-switched laser systems. The invention also relates to a method of manufacturing crystals, including the single crystals referred to, and to optical polarisers incorporating such single crystals.

In order to be suitable for use as a polariser in a Q-switched laser system, a crystal is required to possess certain critical optical properties, including high birefringence, the ability to transmit a high proportion of the light available after splitting and polarisation of the incident light, and a high contrast ratio (the ratio between the light passed during the transmission and extinction phases of the polariser), and is also required to have good chemical and thermal stability and to be of a high degree of chemical purity and crystalline perfection, the last-mentioned property ensuring that the crystal has a relatively high laser-induced damage threshold. Naturally occurring calcite crystals have hitherto been employed for this application, but it has not been found possible to obtain ideal optical conditions with a polariser of conventional design comprising a calcite crystal, and moreover natural calcite crystals have variable laser-induced damage thresholds, for example varying from 5 to 15 MWmm$^{-2}$ at the neodymium emission wavelength of 1.06 microns, and thus in many cases are liable to suffer damage during operational life, under normal operating conditions of a laser system.

It is one object of the invention to provide synthetic birefringent single crystals having advantageous properties in comparison with those of natural calcite, in respect of relatively high birefringence and a laserinduced damage threshold which is of adequate magnitude and does not vary appreciably from crystal to crystal. It is a further object of the invention to provide a method of manufacturing crystals, whereby it is possible to produce said birefringent crystals of such size, chemical purity, and crystalline perfection as to render them suitable for use as polariser crystals in Q-switched laser systems.

According to the first aspect of the invention, there is provided a synthetic birefringent crystal classified in the orthorhombic crystal system, or dimensions at least three millimetres along each of the three crystallographic axes, consisting of substantially pure lead carbonate (PbCO$_3$) and having a crystalline form similar to that of the mineral cerussite.

The synthetic cerussite crystals in accordance with the invention possess high birefringence, namely 0.27, in comparison with the figure of 0.17 for calcite, are chemically and thermally stable, and when in a condition of high crystalline perfection have a laser-induced damage threshold exceeding 10MWmm$^{-2}$ at 1.06 microns wavelength and are free from defective areas having a lower damage threshold. These crystals, when grown to a suitable size, are therefor advantageous for use as polariser prisms in Q-switched laser systems. Polariser crystals are generally required to be somewhat larger than 3 millimeters along each axis, for example 6 to 10 millimeters along each axis, so it is desired to provide a method of manufacture by which crystals of such size, and of the requisite chemical purity and crystalline perfection, can be obtained.

The suitability of crystals of natural or synthetic cerussite for use in Glan air-spaced polarisers incorporated in Q-switched laser systems is disclosed in the specification of co-pending British Patent Application No. 15918/74. The present invention resides, in its first aspect, in the provision of synthetic cerussite crystals of selected minimum dimensions as aforesaid, which crystals are suitable for use in optical polarisers, and in its second aspect in the provision of a method, for the manufacture of metal carbonate crystals, which can be employed for the manufacture of cerussite crystals of such dimensions.

The growth of crystals of some metal carbonates by hydrothermal techniques has been described previously: crystals which have been grown in this manner, using aqueous solutions of alkali metal chlorides and ammonium chloride as the solvent media, include otavite (cadmium carbonate), calcite (calcium carbonate), siderite (ferrous carbonate), and smihsonite (zinc carbonate). However, we are not aware that cerussite (lead carbonate) crystals of appreciable size have previously been produced synthetically. We have now found that cerussite crystals, including crystals of the sizes referred to above, can be produced by an improved hydrothermal process, which is also applicable to the production of crystals of other metal carbonates.

According, therefore, to the second aspect of the invention, a method of manufacturing crystals of a metal carbonate comprises heating in a sealed vessel, under superatmospheric pressure, a quantity of nutrient material consisting of a carbonate or basic carbonate of said metal, in contact with a solvent mixture consisting of an aqueous solution of an alkali metal bicarbonate, of concentration in the range of 0.5 to 5 molar, the vessel being heated in such a manner that the exterior of the vessel wall adjacent to the nutrient material and the region of the solvent medium in the vicinity thereof is maintained at a temperature in the range of 200° to 400° and that the exterior of the vessel wall adjacent to the region of the solvent medium remote from the nutrient material is maintained at a temperature which is in the range of 170° to 315° C and is from 5° to 150° C lower than that of the exterior of the vessel wall adjacent to the nutrient material, whereby a temperature gradient is produced in the solvent medium and the said metal carbonate crystallises out in a location remote from the nutrient material.

A conventional steel autoclave, disposed vertically, can be employed for the hydrothermal process of the invention: the nutrient material is placed at the bottom of the autoclave chamber, the greater part of the free space in which is filled with the solvent medium, and crystal deposition takes place in the upper part of the chamber, either in the form of small crystals deposited on the chamber wall, or as crystal growth on seeds suspended in the upper region of the solvent medium, to produce relatively large single crystals.

The nutrient material may be in the form of powder or granules of the metal carbonate or basic carbonate, or may consist of small crystals of the carbonate: thus small carbonate crystals deposited on the autoclave wall are suitably used as nutrient material for the subsequent production of single crystals grown on seeds. The solvent medium is preferably an aqueous solution of sodium bicarbonate or potassium bicarbonate. The degree of filling of the autoclave chamber with solvent medium is not critical, but preferably exceeds 80% of the free space in the chamber, and must not be so high as to produce, in operation, a pressure exceeding the maximum pressure which can be withstood by the autoclave or the seal thereof, normally approximately 2000 atmospheres. The degree of filling is suitably from 80 to 95% of the free space, at room temperature, depending upon the mean temperature of the solvent medium in operation: thus the lower the said temperature, the higher the degree of filling permissible, or required, to give a suitable operating pressure, which is usually in the range of 500 to 1500 atmospheres.

The duration of the heating is determined by the quantity of nutrient material present, and/or by the size of single crystals required in relation to the rate of deposition of crystalline material from the solution of nutrient in the solvent medium. Thus, heating is continued either until most of the nutrient material has been consumed or, in the case of the growth of single crystals, until crystals of the desired size have been obtained.

In a preferred method in accordance with the invention, for the manufacture of one or more single crystals of lead carbonate, of cerussite form and of dimensions at least 3 mm along each crystallographic axis, the nutrient material employed may consist of basic load carbonate ($2PbCO_3.Pb(OH)_2$) powder or lead carbonate crystals, the solvent medium employed is a 2 molar aqueous solution of potassium bicarbonate ($KHCO_3$), filling from 85 to 93% of the free space of the autoclave chamber at room temperature so as to give an operating pressure of approximately 1000 atmospheres, one or more seed crystals of lead carbonate is or are supported in the upper part of the autoclave chmber so as to be located within and near the surface of the potassium bicarbonate solution, the lower part of the autoclave chamber containing the nutrient material is maintained at an external temperature in the range of 200° to 300° C, and the upper part of the autoclave chamber containing the seed or seeds is maintained at an external temperature in the range of 170° to 240° C and from 20° to 80° C lower than that of the said lower part of the autoclave chamber.

The nutrient material employed in the above-described preferred method preferably consists of small crystals of lead carbonate produced by the method of the invention, and the seeds may be natural cerussite crystals, or suitably orientated sections cut from synthetic cerussite crystals previously grown by the method of the invention: the seeds are preferably cut so that crystal growth will take place on a surface of the {111} or {021} type orientation, as identified by the Miller indices. In order to grow single crystals of high crystalline perfection, it is necessary to use seeds of the best quality available: good quality portions of cerussite crystals may be used initially, and the crystals grown on these initial seeds are suitably used as seeds in subsequent runs; preferably the seeds for each run are crystals grown in a preceding run, or portions of such crystals, the quality of the crystals grown then tending to improve with each succeeding run. Preferred heating conditions are such as to maintain the lower part of the autoclave chamber containing the nutrient material at an external temperature of 220° to 280° C, and the upper part of the autoclave chamber containing the seed or seeds at an external temperature of 180° to 220° C and from 40° to 70° C lower than that of the said lower part of the autoclave chamber.

In a preferred method of manufacturing small crystals of lead carbonate of cerussite form, suitable for use as the nutrient material for the growth of single crystals of cerussite by the method described above, the nutrient material employed is basic lead carbonate powder, the solvent medium is a 2 molar aqueous solution of potassium bicarbonate, filling from 80 to 90% of the free space in the autoclave chamber at room temperature, the lower part of the autoclave chamber containing the nutrient material is maintained at an external temperature in the range of 240° to 360° C, and the uppermost part of the autoclave chamber is maintained at an external temperature in the range of 200° to 280° C and from 20° to 120° C lower than that of the said lower part of the autoclave chamber.

The rate of transport of dissolved nutrient material through the solvent medium and deposition thereof as crystalline lead carbonate, and hence the rate of growth of single crystals of cerussite when seeds are present, are controlled by the temperature gradient in the solvent medium. In general, a higher transport rate, and hence a higher temperature gradient, can be tolerated when it is required to obtain only deposition of small crystals on the autoclave wall than is the case when growth on seeds is required, since a high transport rate tends to favour deposition on the wall. For the growth of single crystals on seeds, the rate of transport should be sufficiently high to give a practical growth rate, but not so high as to cause the deposition of crystalline material or poor quality with regard to chemical purity or crystalline perfection, or to cause excessive deposition on the autoclave wall. A suitable growth rate is such as to produce a thickness of 0.1 to 0.5 millimeter per day on the appropriate surface or surfaces of the seed crystal. The growth rate may be slower than this if the external temperature in the upper part of the autoclave is below 180° C or if the temperature difference between the top and bottom of the chamber is less than 40° C, and excessive wall deposits may be obtained if the external temperature in the upper part of the autoclave is above 220° C or if the said temperature difference exceeds 70° C. Under some conditions improved single crystal growth can be obtained by the use of a baffle located in the solvent medium between the nutrient and the seeds: a suitable form of baffle consists of a horizontal steel disc with a central aperture, the disc fitting closely within the autoclave chamber wall and being supported by steel wires or rods. The presence of such a baffle tends to increase the rate of growth on the seeds by encouraging upward flow at the centre of the autoclave, and also tends to increase the internal temperature gradient by reducing convection currents. The aperture of the baffle should, of course, be sufficiently large to prevent its becoming blocked by deposited crystalline material.

Some specific methods in accordance with the invention, for the manufacture of cerussite crystals, will now be described in the following examples, with reference to the accompanying drawing, in which the form of vessel employed for carrying out the methods is shown diagrammatically, in part-sectional elevation.

The vessel shown in the drawing is an unlined steel autoclave 1 of conventional design, having at the top end a flange 2 to which a lid 3 is bolted with a sealing ring 4 between the flange and the lid, the thickness of the ring being greater at its inner edge than at its outer edge, so that the sealing surfaces of the ring are conical: these surfaces of the ring make contact with appropriately shaped lapped surfaces on the flange and lid. For carrying out the processes of the examples, nutrient material is placed in the bottom of the autoclave chamber 5, as shown at 6, and one or more seed crystals 7, when required, are suspended from the top of the autoclave by means of iron wires 8 attached to a steel or tungsten rod 9 supported on the inner edge of the sealing surface of the autoclave, the seeds being located below the surface of the solvent medium 10 filling the greater part of the chamber 5. A baffle is provided for use within the autoclave chamber, when required: this baffle consists of a steel disc 11 fitting closely to the chamber wall, and having a central aperture 12, the disc being held in position by a single loop of steel wire 13 making spring contact with the autoclave chamber wall. The autoclave is enclosed within an electric furnace 14 provided with upper and lower heating coils (not shown) to give the required upper and lower temperatures within the autoclave chamber; thermocouples 15, 16, 17, and 18, for monitoring the temperatures at various levels in the autoclave, are inserted through the furnace wall.

If desired, minor modifications may be made to the design of the autoclave as shown: for example, the rod 9 from which the seed or seeds are suspended may be supported on projections formed in the sealing ring 4, instead of on the sealing surface of the autoclave. We have also found that when growing single crystals, wall deposits can be reduced by lining the autoclave chamber and lid with polytetrofluoroethylene.

The chamber 5 of the autoclave employed for the methods of Examples 1 and 2 has an internal diameter of 22 mm and an internal length of 22.7 cm.

EXAMPLE 1

Small crystals of cerussite are first produced from nutrient material consisting of 50 grams of basic lead carbonate of a commercially pure grade, which is placed in the bottom of the autoclave chamber, as shown at 6 in the drawing, together with a sufficient volume of a 2 molar solution of commercially pure potassium bicarbonate in distilled water to fill 85% of the free space in the chamber, and the autoclave is sealed. The autoclave, which is employed without a baffle for this first stage in the process, is then heated under controlled conditions to produce an external temperature of 300° C at the bottom of the chamber, and an external temperature 40° to 50° C lower at the top of the chamber, as indicated by the thermocouples 18 and 15 respectively; the internal pressure developed is approximately 1000 atmospheres. Continuous heating for 5 days under these conditions results in solution and transportation of most of the nutrient material, and deposition of the lead carbonate ($PbCO_3$) content thereof on the lid and upper part of the wall of the autoclave, in the form of small cerussite crystals up to about 2 mm in each dimension.

The small cerussite crystals produced in this manner are employed as the nutrient material for the growth of large single crystals of cerussite. 75 grams of these small crystals are placed in the bottom of the autoclave chamber, with sufficient 2 molar aqueous potassium bicarbonate solution to fill 91% of the free space in the chamber, and seeds in the form of pieces of natural cerussite are suspended from the top of the autoclave, as shown in the drawing. A baffle 11, the central aperture of which is 7 mm in diameter, is placed in position between the nutrient material and the seeds. The lower part of the autoclave chamber is heated to 250° C, and the upper part to 190° C, as indicated by the thermocouples 18 and 15 respectively, giving a temperature gradient of 60° C between the nutrient and the seeds; the pressure produced in operation is estimated to be approximately 1000 atmospheres.

In one specific run carried out under these conditions, a single seed initially weighing 0.54 gram was employed, and after 10 days was found to have increased in weight to 1.47 grams: thus the average growth rate was 0.125 mm thickness of crystal per day on each surface of the seed. In addition, some small cerussite crystals were deposited on the autoclave lid and wall: these crystals were available for use as nutrient material in furture growth runs.

EXAMPLE 2

100 grams of crystalline nutrient material produced as described in Example 1 are employed for the growth of cerussite crystals on two seeds each consisting of a plate of {111} orientation, of dimensions 10 × 10 × 1 mm, cut from natural cerussite crystals or from synthetic crystals grown in a previous run. The solvent medium is 2 molar aqueous potassium bicarbonate solution, filling 91% of the free space in the autoclave chamber, and the heating is carried out in such a manner that the temperature gradient between the nutrient and the seeds is 45° to 55° C, the upper and lower temperatures, shown by thermocouples 15 and 18, being 190° C and 235°–245° C respectively, and a baffle as described in Example 1 being provided in the autoclave chamber. During a continuous operation of 20 days duration, good quality, transparent cerussite is deposited to a thickness of 3 mm on each side of each seed plate.

EXAMPLE 3

For the growth of large cerussite crystals, an autoclave of similar construction to that used in Examples 1 and 2, as shown in the drawing, but with a chamber 5 of 63 mm bore and 28.5 cm long, and provided with a baffle 11 having a 12 mm diameter central aperture, is employed. The nutrient material consists of 500 grams of small cerussite crystals produced by a method similar to that described in Example 1, but using 500 grams of load carbonate or basic lead carbonate powder as the nutrient material, and with top and bottom external temperatures of 250° C and 350° C respectively, and with the potassium bicarbonate solution filling 83% of the free space in the chamber. The solvent medium for the crystal growing process is a 2 molar aqueous potassium bicarbonate solution, filling 90% of the free space in the autoclave chamber. Three seeds consisting of {111} plates, 20 × 20 × 2 mm in dimensions, cut from cerussite crystals grown in previous runs, are suspended in vertical alignment from the top of the autoclave. The lower part of the chamber is heated to 250°–270° C (shown by thermocouple 18) and the upper part to 200° C (shown by thermocouple 15), giving a temperature gradient of 50°–70° C between the nutrient and the seeds. Under these conditions, continuous operation for 30 to 40 days is required to produce a growth of 6 mm thickness on each side of the seed plates.

The grown material is cut from the seeds to give transparent cerussite crystals of high chemical purity and crystalline perfection, which are suitable for use as polariser prisms in Q-switched laser systems.

We claim:

1. A method of manufacturing crystals of lead carbonate, which comprises heating in a sealed autoclave, under pressure of 500 to 1500 atmospheres, a quantity of nutrient material consisting of a compound of lead which is a member of the group consisting of the carbonate and the basic carbonate, in contact with a solvent medium consisting of an aqueous solution of an alkali metal bicarbonate of concentration in the range of 0.5 to 5.0 molar, which solvent medium occupies from 80 to 95% of the free space in the autoclave chamber, the autoclave being heated in such a manner that the exterior of the autoclave wall adjacent to the nutrient material and to the region of the solvent medium in the vicinity thereof is maintained at a temperature in the range of 200° to 400° C and that the exterior of the autoclave wall adjacent to the region of the solvent medium remote from the nutrient material is maintained at a temperature which is in the range of 170° to 315° C and is from 5° to 150° C lower than that of the exterior of the autoclave wall adjacent to the nutrient material, whereby a temperature gradient is produced in the solvent medium and the lead carbonate crystallises out in a location remote from the nutrient material.

2. The method according to claim 1 wherein, for the manufacture of a single crystal of lead carbonate having a crystalline form similar to that of the mineral cerussite, the nutrient material consists of a substance of the group consisting of basic lead carbonate ($2PbCO_3.Pb(OH)_2$) powder and lead carbonate crystals, the solvent medium employed is a 2 molar aqueous solution of potassium bicarbonate ($KHCO_3$), occupying from 85 to 93% of the free space in the autoclave chamber at room temperature so as to give an operating pressure of approximately 1000 atmospheres, a seed crystal a lead carbonate of the cerussite crystalline form is supported in the upper part of the autoclave chamber so as to be located within and near the surface of the potassium bicarbonate solution, the lower part of the autoclave chamber containing the nutrient material is maintained at an external temperature in the range of 200° to 300° C, and the upper part of the autoclave chamber containing the seed crystal is maintained at an external temperature in the range of 170° to 240° C and from 20° to 80° C lower than that of the said lower part of the autoclave chamber, whereby a said single crystal is grown on the seed crystal.

3. The method according to claim 2, wherein the nutrient material consists of lead carbonate crystals manufactured by a process which comprises heating in a sealed autoclave, under pressure of approximately 1000 atmospheres, a quantity of nutrient material consisting of basic lead carbonate powder, in contact with a solvent medium consisting of a 2 molar aqueous solution of potassium bicarbonate, which solvent medium occupies from 80 to 90% of the free space in the autoclave chamber at room temperature, the lower part of the autoclave chamber containing the nutrient material being maintained at an external temperature in the range of 240° to 360° C, and the uppermost part of the autoclave chamber being maintained at an external temperature in the range of 200° to 280° C and from 20° to 120° C lower than that of the said lower part of the autoclave chamber, whereby small crystals of lead carbonate are deposited on the wall of the upper part of the autoclave chamber.

4. The method according to claim 2, wherein the said seed crystal is cut so that crystal growth will take place on a surface of one of the orientation types consisting of {111} and {021}, as identified by the Miller indices.

5. The method according to claim 2, wherein the said lower part of the autoclave chamber is maintained at an external temperature of 220° and 280° C, and the said upper part of the autoclave chamber is maintained at an external temperature of 180° to 220° C and from 40° to 70° C lower than that of the said lower part of the autoclave chamber.

6. The method according to claim 4, wherein the temperature conditions maintained during the deposition of crystalline material on the said seed crystal are such that a thickness of 0.1 to 0.5 millimeter per day is deposited on said surface.

7. The method according to claim 2, wherein a baffle is located in the potassium bicarbonate solution between the nutrient material and the seed crystal.

* * * * *